United States Patent
Giaretta et al.

(10) Patent No.: US 7,668,464 B2
(45) Date of Patent: Feb. 23, 2010

(54) CONTROL OF PEAKING OF LASER DRIVER CURRENT TO IMPROVE EYE QUALITY

(75) Inventors: Giorgio Giaretta, Mountain View, CA (US); Andreas Weber, Los Altos, CA (US); Dan Case, Gilroy, CA (US)

(73) Assignee: Finisar Corporation, Sunnyvale, CA (US)

( * ) Notice: Subject to any disclaimer, the term of this patent is extended or adjusted under 35 U.S.C. 154(b) by 447 days.

(21) Appl. No.: 10/704,096

(22) Filed: Nov. 6, 2003

(65) Prior Publication Data

US 2004/0131362 A1    Jul. 8, 2004

Related U.S. Application Data

(60) Provisional application No. 60/424,216, filed on Nov. 6, 2002.

(51) Int. Cl.
  *H04B 10/00* (2006.01)
  *H01S 3/00* (2006.01)

(52) U.S. Cl. .................. 398/135; 398/136; 398/137; 398/138; 372/29.015; 372/38.02; 372/38.07

(58) Field of Classification Search ......... 398/135–139, 398/164, 201; 372/38, 38.02, 31; 359/172; 235/454

See application file for complete search history.

(56) References Cited

U.S. PATENT DOCUMENTS

| | | | |
|---|---|---|---|
| 5,019,769 | A | 5/1991 | Levinson |
| 5,383,208 | A | 1/1995 | Queniat et al. |
| 5,978,393 | A * | 11/1999 | Feldman et al. ............... 372/31 |
| 6,285,692 | B1 * | 9/2001 | Okayasu ................... 372/38.02 |
| 6,446,867 | B1 * | 9/2002 | Sanchez ...................... 235/454 |
| 6,947,456 | B2 * | 9/2005 | Chin et al. ............... 372/38.02 |
| 7,127,177 | B1 | 10/2006 | Weber |

(Continued)

FOREIGN PATENT DOCUMENTS

DE    101 60 927    6/2002

(Continued)

OTHER PUBLICATIONS

Abe et al: "Short Wave SFF Small Form Factor Transceivers", 2001 Electronic Components and Technology Conference, May 29-Jun. 1, 2001, pp. 30-34.*

*Primary Examiner*—Ken N Vanderpuye
*Assistant Examiner*—Li Liu
(74) *Attorney, Agent, or Firm*—Workman Nydegger

(57) ABSTRACT

An optical transceiver module having digital control of laser current peaking is disclosed. The optical transceiver module comprises a controller and integrated post-amplifier/laser driver, which are included on a printed circuit board disposed in the module. Transmitting and receiving optical sub-assemblies are also disposed in the module. A digital signal interface interconnects the controller with the integrated post-amplifier/laser driver. Digital control signals produced by the controller are transmitted via the digital signal interface to the integrated post-amplifier/laser driver, where they are converted to analog control signals. The analog control signals are forwarded to control components responsible for governing the electrical current supplied to the laser of the transmitting optical sub-assembly. The laser current is intermittently peaked by the control signal in order to hasten the transition from light to no-light emission, thereby improving laser response and performance.

23 Claims, 4 Drawing Sheets

U.S. PATENT DOCUMENTS

| | | | |
|---|---|---|---|
| 2002/0085599 A1* | 7/2002 | Schrodinger | 372/38.02 |
| 2002/0094000 A1* | 7/2002 | Heilman et al. | 372/38.02 |
| 2002/0149821 A1* | 10/2002 | Aronson et al. | 359/152 |
| 2002/0181520 A1* | 12/2002 | Iguchi et al. | 372/38.02 |
| 2002/0181894 A1* | 12/2002 | Gilliland et al. | 385/88 |
| 2004/0067060 A1* | 4/2004 | Aronson et al. | 398/135 |
| 2004/0264526 A1* | 12/2004 | Schrodinger | 372/38.1 |

FOREIGN PATENT DOCUMENTS

| | | |
|---|---|---|
| WO | WO 02/33858 | 4/2002 |
| WO | WO 2004/013979 | 2/2004 |
| WO | WO 2004/034098 | 4/2004 |

\* cited by examiner

CONTROL OF PEAKING OF LASER DRIVER CURRENT TO IMPROVE EYE QUALITY

CROSS-REFERENCE TO RELATED APPLICATIONS

This applications claims the benefit of U.S. Provisional Patent Application Serial No. 60/424,216, filed Nov. 6, 2002, which is incorporated herein by reference.

BACKGROUND OF THE INVENTION

1. The Field of the Invention

The present invention relates to optical transceiver modules for use in optical communication networks. More specifically, the present invention relates to using a laser driver with signal conditioning capability as a component of the transceiver to control laser current characteristics and to improve the optical eye pattern quality associated with data signals generated by the laser.

2. The Related Technology

In the field of data transmission, one method of efficiently transporting data is through the use of fiber optics. Digital data is propagated through a fiber optic cable using light emitting diodes or lasers. Light signals allow for extremely high transmission rates and very high bandwidth capabilities. Also, light signals are resistant to electromagnetic interferences that would otherwise interfere with electrical signals. Light signals are more secure because they do not allow portions of the signal to escape from the fiber optic cable as can occur with electrical signals in wire-based systems. Light also can be conducted over greater distances without the signal loss typically associated with electrical signals on copper wire.

Light signals are transmitted and received using transceivers, which include a transmitting component, or transmitter, having a laser and laser driver and a receiving component, or receiver, having a photodetector, a pre amplifier and a post amplifier. The transmitting component of the transceiver receives electrical signals representing network or communication data and processes the electrical signals to achieve the result of modulating the network or communication data onto an optical signal generated by the laser driver and the associated laser. The receiving component of the transceiver receives an optical signal from an optical fiber and converts the optical signal to an electrical signal that is used by an electronics or computing device connected with the transceiver.

Conventional transceivers include a separate post-amplifier and laser driver that are controlled using analog control signals sent by a controller component. The control signals are used for various purposes, most of which relate to adjusting the operation of the laser or the receiver in response to variations in the temperature of those components. The use of analog control signals has generally limited the number of separate parameters that can be controlled, since each separate controllable parameter associated with the operation of the receiver or transmitter requires a separate electrical connection used for transmission of a separate control signal associated with the controllable parameter. The use of multiple analog signals becomes increasingly difficult as the number of controllable parameters grows, particularly in view of the trend toward smaller transceivers. Thus, the use of analog control signals creates added complexity and expense to the design and manufacture of the transceiver PCB, while requiring each IC to be larger in size.

Lasers are used to encode data in an optical signal by representing digital bits of data as "1's" and "0's" that correspond to the presence or absence of the laser light. During recent years, data transmission rates in optical networks have increased, and conventional optical networks operate at 2.5 Gigabits ("Gbits")/second or higher. As the data transmission rates increase, the characteristics of the laser operation in response to a signal from the laser driver to turn on or off become increasingly important. In general, lasers used in optical networks respond more quickly to a signal to turn on (e.g., application of a current that excites electrons and causes the emission of photons) than to a signal to turn off (e.g., removal of the current). As a result, the eye pattern, which represents the quality of the optical data signal, can deteriorate at high data transmission rates and can become a limiting factor associated with the maximum data rates that can be achieved with a given laser.

There is therefore a need for an optical transceiver that enables control over the various operational parameters of the transceiver components while minimizing the complexity and cost of the transceiver. In particular, a need exists for an optical transceiver that is capable of controlling laser operation such that modulation of a data signal is optimized, especially in high-speed optical networks.

BRIEF SUMMARY OF THE INVENTION

Briefly summarized, embodiments of the present invention are directed to an optical transceiver device having digital control of various parameters associated with operation of the device. In particular, the present invention enables digital control over laser driving characteristics of the transceiver device, thereby optimizing laser operation and enabling it to modulate and transmit data via high-speed optical communications networks.

In one embodiment, the present optical transceiver comprises a controller chip coupled to a laser driver and post-amplifier. Each of these components is disposed on a printed circuit board, which is at least partially contained with a transceiver module housing. The laser driver and post-amplifier are preferably integrated as a single component on the printed circuit board, providing certain operational advantages and economy. The integrated laser driver/post-amplifier governs the operation of both a transmitter optical sub-assembly and a receiver optical sub-assembly. The receiver optical sub-assembly receives modulated optical signals from the network and converts them back to electrical data signals for use by one or more connected components. Correspondingly, the transmitter optical sub-assembly converts an electrical data signal into a modulated optical signal for transmission to an optical communications network. The electrical data signal is converted to an optical signal via a laser. In its on state, the laser is powered by an electrical power signal, which causes charge carriers to amass in an active region of the laser, which stimulates the emission of coherent laser light. In its off state, the electrical power signal is removed from the laser, which causes charge carriers to dissipate from the active region and cease the production of laser light. Thus, the transmitter and receiver optical sub-assemblies, the integrated laser driver/post-amplifier, and the controller are interconnected so as to function together in transmitting and receiving optical signals.

In accordance with embodiments of the present invention, a digital interface is established between the controller and the laser driver/post-amplifier to enable digital control of transceiver elements. The digital interface comprises digital serial interface nodes disposed on both the controller and the integrated laser driver/post-amplifier, with digital signal lines disposed therebetween. Preferably, three digital signal lines for transmitting data, enable, and clock signals are disposed between the digital interface nodes.

During operation of the optical transceiver, the controller issues digital control signals intended for use by one of a plurality of control devices disposed in the laser driver/post-amplifier. These digital control signals are relayed from the controller's digital interface node to the laser driver/post-amplifier digital interface node via the digital signal data line. After receipt by the laser driver/post-amplifier interface node, the digital control signal is distributed to one of a plurality of digital-to-analog converters disposed on the laser driver/post-amplifier. A glue logic device also disposed on the laser driver/post-amplifier selects the appropriate digital-to-analog converter to be used in converting the digital control signal. The digital control signal is converted by the digital-to-analog converter into an analog control signal, then relayed to the appropriate control device of the laser driver/post-amplifier, such as a control amplifier, or other device. The analog control signal is used by the control device to modify a specified operational parameter related to the post-amplifier/laser driver.

In accordance with embodiments of the present invention, operational parameters of the laser disposed in the transmitter optical sub-assembly are controllable via the digital control signals as explained above. In particular, the laser driver current signal responsible for powering the laser to its "on" or "off" state can be controlled so as to prevent asymmetric eye pattern characteristics in the laser. To energize the laser to its on state, a digital control signal to direct laser operation is sent from the controller to the post-amplifier/laser driver via the digital interface. The digital control signal is converted to an analog control signal and forwarded to laser current control circuitry, where it directs the laser driver current to power the laser to its on state. As mentioned, in its on state the active region of the laser is filled with charge carriers to produce coherent laser light. When the laser is to be switched to its off state, a digital control signal from the controller is similarly converted and conveyed to the laser current control circuitry to direct the laser driver current to switch the laser to its off state. This causes charge carriers to be dissipated from the active region of the laser, thereby terminating coherent light production by the laser.

In accordance with one embodiment, the digital control signal to power off the laser is configured so as to improve the eye pattern created by operation of the laser. Upon initial power off, the converted control signal peaks the laser driver current such that the charge carriers are extracted from the active region at an accelerated rate. This causes the laser signal to more quickly transition from its light-producing on state to its off state. Shortly after, the peaking control signal is terminated, and the laser's active region is allowed to drain the rest of the charge carriers naturally. In this way, the laser is assisted in quickly transitioning from its on state to its off state, thereby improving the waveform of the laser signal, and reducing error rates in the data signal modulated and transmitted thereby.

Advantages gained from the present invention include simpler IC design, which results in reduced fabrication costs. Less space is occupied by the present transceiver, enabling more flexibility in its design. Also, enhanced control over transceiver components is possible, given the ability of the present invention to digitally control a large number of parameters relating to transceiver operation, such as laser driver current.

These and other features of the present invention will become more fully apparent from the following description and appended claims, or may be learned by the practice of the invention as set forth hereinafter.

BRIEF DESCRIPTION OF THE DRAWINGS

The appended drawings contain figures of embodiments of the present invention. The above-mentioned features of the invention, as well as other features, will be described in connection with the disclosed embodiments. However, the illustrated embodiment is only intended to illustrate the invention and not limit the invention. The drawings contain the following figures.

DETAILED DESCRIPTION OF PREFERRED EMBODIMENTS

Reference will now be made to the drawings to describe the invention. It is to be understood that the drawings are diagrammatic and schematic representations of presently preferred embodiments, and are not limiting of the present invention, nor are they necessarily drawn to scale.

The present invention relates to techniques for digitally controlling a laser driver in a transceiver so as to improve the eye pattern quality associated with an optical signal. According to the invention, a laser driver is controlled using digital control signals received from a controller integrated circuit (IC). The digital control signals and the associated digital signal interface of the laser driver enable any of a number of operating parameters or characteristics of the laser driver and the associated laser to be controlled. According to the invention one such parameter is the driving of an electrical signal to the laser that more rapidly extracts charge carriers from the active region of the laser after the removal of the current, which more quickly decreases the power output of the laser and turns the laser off.

I. Transceiver Architecture

Figure 1:
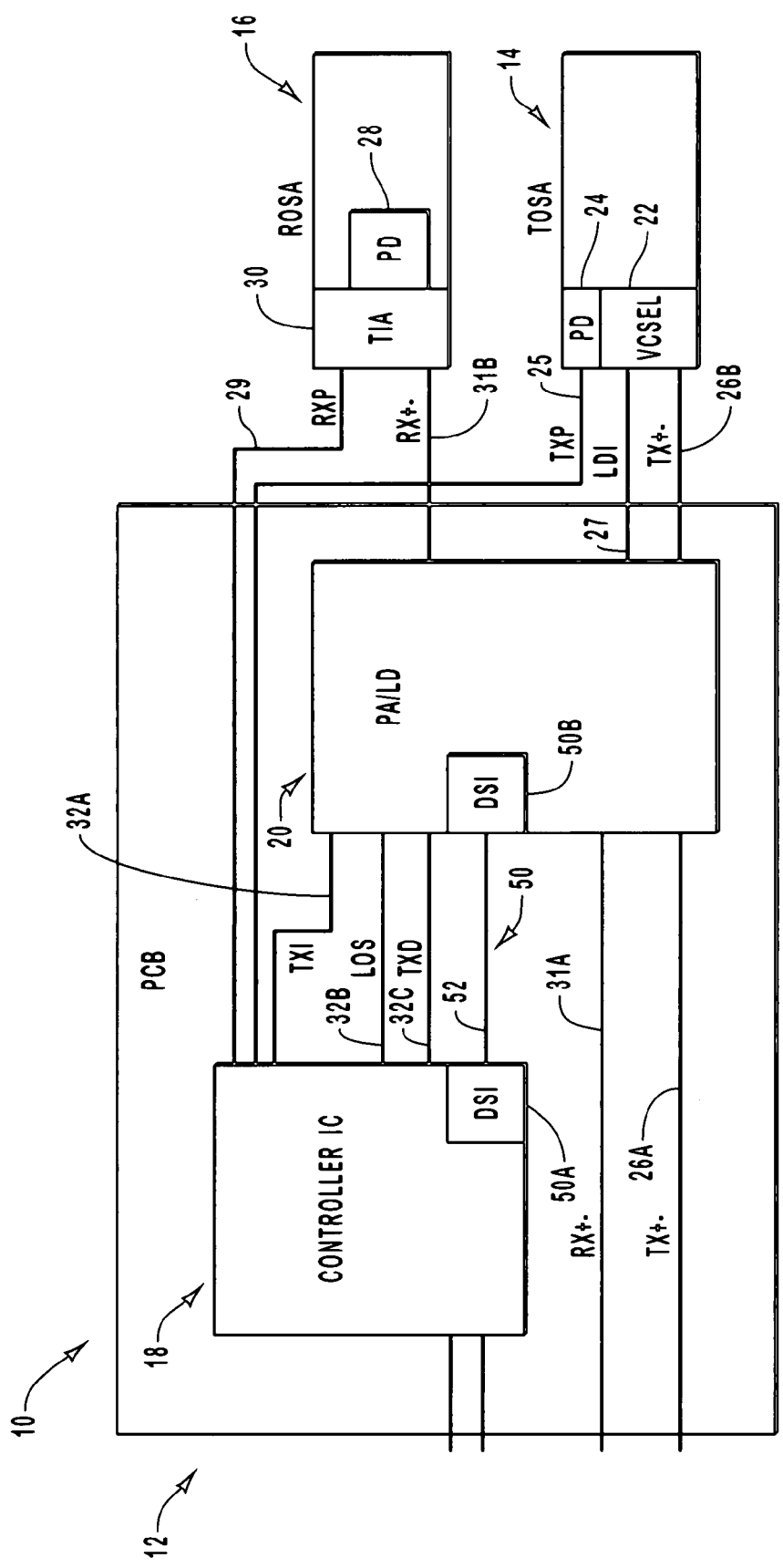
FIG. 1 is a schematic diagram representing an architecture of a transceiver having an integrated laser driver and post-amplifier, as well as a digital interface.

Reference is first made to FIG. 1, which depicts various components comprising an optical transceiver, generally designated at 10. The transceiver 10 generally includes a printed circuit board ("PCB") 12, a transmitter optical subassembly ("TOSA") 14, and a receiver optical subassembly ("ROSA") 16.

Both the TOSA 14 and the ROSA 16 are electrically connected to a controller 18 and a post-amplifier/laser driver ("PA/LD") 20, which are in turn disposed on the PCB 12. Generally, these components cooperate to enable the transceiver 10 both to transmit and to receive optical signals that travel via an optical communications network (not shown). For instance, the PA/LD 20 is responsible for conditioning data signals that are to be transmitted by the TOSA 14, as well as conditioning data signals received by the ROSA 16. As will be explained, the controller 18 is responsible for governing the operation of the TOSA 14, ROSA 16, and other components that comprise the optical transceiver 10.

In greater detail, the PA/LD 20 can receive an electrical data signal to be transmitted from a connected host device, such as a computer (not shown), via line 26A. The PA/LD 20 conditions that signal for receipt by the TOSA 14 via line 26B. A laser 22, disposed in the TOSA 14 and powered by a DC current that is conducted via current line 27 (indicated by "LDI" for "laser driver current"), receives the conditioned electrical data signal and converts it into an optical data signal for transmission to the optical communications network. A photodiode 24 is also disposed in the TOSA 14 to monitor the operation of the laser 22. Specifically, the photodiode 24 can communicate data relating to the light power with which the laser 22 is transmitting to the controller 18 via a communication line 25, indicated by "TXP" for "transmitter power."

Analogous to the above discussion, an incoming optical data signal from the optical communications network can be received by the optical transceiver 10 into the ROSA 16. A photodiode 28 and amplifier 30 in the ROSA 16 cooperate to convert and initially amplify the optical data signal into an electrical data signal, which is then forwarded to the PA/LD 20 via line 31B for conditioning before being forwarded to a connected host device, such as a computer (not shown) via line 31A. Information regarding the power at which the ROSA 16 is receiving the optical data signal from the communications network can be relayed to the controller 18 via a communication line 29, indicated by "RXP" for "receiver power."

As shown in FIG. 1, The PA/LD 20 and the controller 18 are interconnected via various communication/control lines. A line 32A extends between the controller 18 and the PA/LD 20 (indicated by "TXI" for "transmitter current") to provide information to the controller 18 concerning the current level supplied to the laser 22 by the LDI line 27. A line 32B extends between the PA/LD 20 and the controller 18 (indicated by "LOS" for "loss of signal") to indicate when the signal received by the ROSA 16 is below detectable levels. A line 32C extends between the PA/LD 20 and the controller 18 (indicated by "TXD" for "transmitter disable") to allow the controller to disable operation of the TOSA 14 when transmission of an optical signal is not desired. Communication lines 32D extending from the controller 18 can be connected with a host device (not shown) to provide identification information and other data relating to transceiver operation to the host device.

Figure 2:
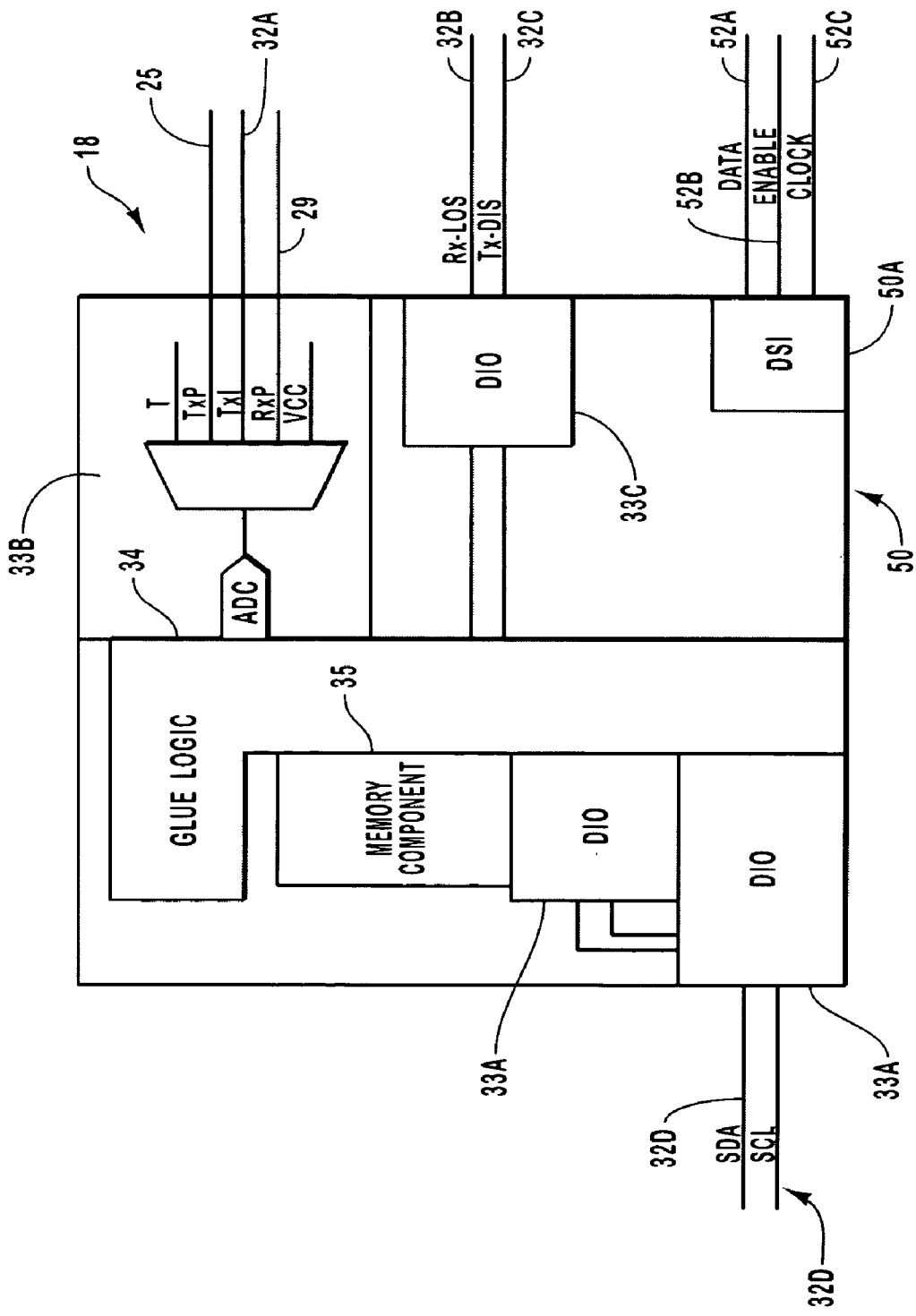
FIG. 2 is a schematic diagram illustrating functional components of one embodiment of a controller component.
Figure 3:
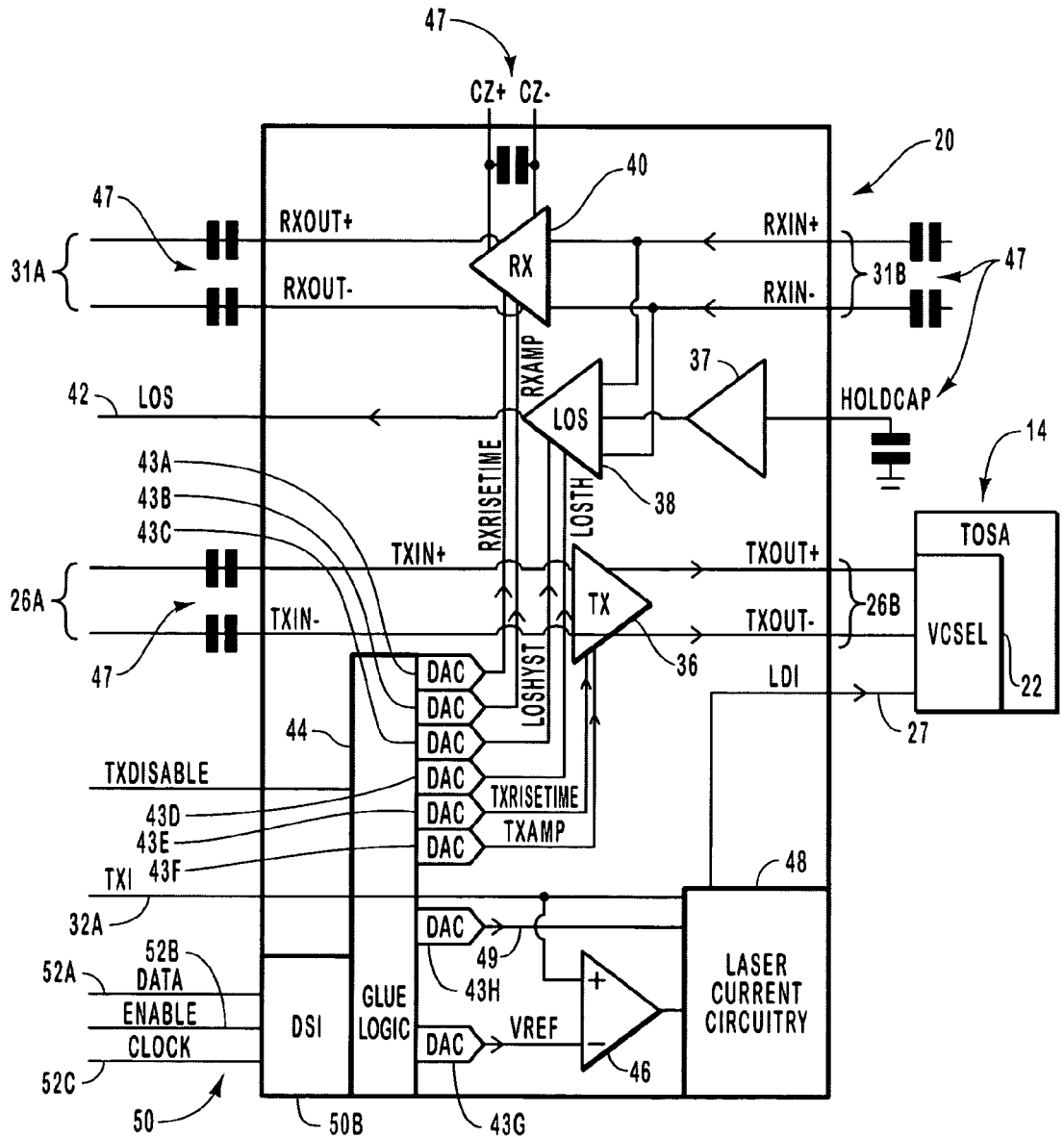
FIG. 3 is a schematic diagram illustrating the functional components of one embodiment of an integrated laser driver and post-amplifier.

Note that the presence of the lines described above are exemplary in accordance with one embodiment of the present invention; thus, the particular implementation of control and communication lines as illustrated in FIGS. 1-3 are not meant to limit the present invention in any way. Thus, alternative or additional lines can also be included.

FIG. 1 further illustrates a digital interface according to one embodiment of the present invention. In the illustrated embodiment, this digital interface comprises a digital serial interface 50 interposed between and interconnecting the PA/LD 20 and the controller 18. As discussed, the digital serial interface 50 enables digital control of transceiver operations by the controller 18. Further details concerning the digital serial interface 50 will be given hereafter.

Reference is now made to FIG. 2, which depicts various aspects of the controller 18. In one embodiment, the controller 18 comprises an integrated circuit disposed on the PCB 12 and having various sub-components, some of which are explained here. The controller 18 includes a glue logic device 34 responsible for managing and distributing controller data and digital control signals relating to the operation of transceiver components, such as the integrated PA/LD 20. A memory component 35 comprising memory arrays, registers, or a combination of both, is disposed in the controller 18 to enable information relating to the operation of the transceiver 10 to be stored. The information stored in the memory component 35 can be gathered from the TOSA 14, ROSA 16, the PA/LD 20, or from various other transceiver components. In one embodiment, the information stored by the memory component 35 can be forwarded to the host device via the communication lines 32D.

The controller 18 further includes various interfacing components to enable the controller to communicate with various devices. For example, digital input/output nodes 33A are disposed on the controller to facilitate communication between the memory component 35 and host device (not shown) via communication lines 32D. Data signals sent from the TOSA 14, the ROSA 16, and the PA/LD 20 via communication/control lines 25, 29, and 32A, respectively, are received by the controller 18 via an interface 33B. In a similar manner, signals carried on lines 32B and 32C relating to the receiver loss of signal and transmitter disabling can be received and dispensed by the controller 18 via a digital input-output interface 33C. Finally, a digital node 50A of the digital serial interface 50 is disposed on the controller 18 to interface with a corresponding digital node on the PA/LD 20 via the digital signal lines 52 in accordance with one embodiment of the present invention and as described in further detail below.

It should be remembered that the above interfacing configuration as shown in FIG. 2 is but one possible configuration for the various inputs and outputs associated with the operation of the controller 18. Accordingly, the above description should not be construed to limit the present invention in any way. Furthermore, several of the input and output signals discussed above are either digital or analog; however, the digital or analog nature of any specific signal can be modified from what is illustrated or described herein as may suit a particular application.

As already mentioned, one of the primary responsibilities of the controller 18 is to govern the operation of the TOSA 14 and ROSA 16 such that the electrical and optical data signals associated therewith are properly converted, modulated, transmitted, and received in relation to the communications network and connected devices. The controller 18 governs the TOSA 14 and ROSA 16 via control components disposed in the PA/LD 20 as detailed below. The PA/LD control components are governed by the controller 18 via control signals that are transmitted from the controller to the components. In accordance with one embodiment of the present invention, the transmission of these control signals, such as the laser driver current used to power the laser 22, to the PA/LD 20 is performed digitally via the digital serial interface 50. Digital transmission of the control signals enables enhanced control of transceiver operations while minimizing the amount of control lines needed for such control. The glue logic device 34 is disposed as a component of the controller 18 to organize and arrange these digital control signals produced by the controller 18 before digital transmission to the PA/LD 20. Further details concerning the digital transmission of the control signals via the digital serial interface 50 are given below.

Reference is now made to FIG. 3, which depicts various aspects of the PA/LD 20. As already mentioned, the PA/LD 20 is disposed as an integrated circuit on the PCB 12 and is configured to condition data signals that are to be transmitted or that have been received by the optical transceiver 10. In presently preferred embodiments, the PA/LD 20 is an integrated device, in contrast to known optical transceivers that dispose the post-amplifier as a separate component from the laser driver. Integration of the post-amplifier and the laser driver into a single integrated circuit on the PCB 12 simplifies transceiver design and minimizes pin connections therein. Further details regarding the integrated post-amplifier/laser driver are given in the United States Patent Application entitled "Integrated Post-Amplifier and Laser Driver Assembly with Digital Control Interface," serial number pending, filed Oct. 29, 2002, which is incorporated herein by reference in its entirety. It is appreciated that, in other embodiments, the post-amplifier and the laser driver can be disposed on the PCB 12 as discrete components.

As already mentioned, a plurality of control devices is disposed within the PA/LD 20 to control operational parameters of both the TOSA 14 and the ROSA 16. In particular, control amplifiers 36, 38, 40, and 46 are disposed to modify as needed the operational parameters of the optical transceiver 10. Particularly, the control amplifiers 36, 38, 40, and 46 are employed to modify operational parameters related to the TOSA 14, loss of signal circuitry, the ROSA 16, and the laser bias current, respectively. Various other circuitry and devices 47 are disposed on or in relation to the PA/LD 20 to assist with the operation of the PA/LD as described herein.

In greater detail, the control amplifier 36 is configured to modify parameters associated with electrical data signals received from a host device connected to the optical transceiver. These electrical data signals represent information from the host device that is to be converted to an optical signal and transmitted via the optical communications network to a remote device. As seen in FIG. 3, the incoming electrical data signal from the host device enters the PA/LD 20 and the control amplifier 36 via two opposite-polarity data lines 26A. The control amplifier 36 is configured to condition and amplify the electrical data signal before it is forwarded to the TOSA 14 via two opposite-polarity data lines 26B for conversion into an optical signal and transmission to the optical communications network. In the present embodiment, the control amplifier 36 is configured to adjust at least two parameters of the electrical data signal. Specifically, the control amplifier 36 is configured to adjust the rise time and amplitude of the electrical data signal received from the host device. As will be explained, the magnitude of adjustment of these parameters is controlled via control signals sent by the controller 18 to the control amplifier 36.

In contrast, the control amplifier 40 is configured to condition and amplify an electrical data signal received from the ROSA 16 via opposite-polarity data lines 31B. This electrical data signal represents information intended for the host device that has been previously converted by the ROSA 16 from an optical signal received from the communications network. After conditioning and amplification, the electrical signal is sent via opposite-polarity data lines 31A to a host device that is external to the optical transceiver 10. In the present embodiment, the control amplifier 40 is configured to adjust at least two parameters of the incoming electrical data signal received from the ROSA 16. Specifically, the control amplifier 40 adjusts the rise time and amplitude of the electrical data signal received from the ROSA 16. The magnitude of adjustment of these parameters is controlled via control signals sent by the controller 18 to the control amplifier 40, as detailed further below.

Similar in function to the control amplifiers 36 and 40, the control amplifier 38 is configured to condition and amplify a loss of signal alert signal sent from the PA/LD 20 via the control line 32B. As mentioned, this loss of signal alert is forwarded from the PA/LD 20 to the controller 18 when the strength of the optical signal being received from the optical network by the ROSA 16 drops below a specified level. In connection with this responsibility, the control amplifier 38 can in one embodiment also include an additional amplifier 37. At least two parameters, the threshold level and hysteresis of the loss of signal alert signal, can be modified by the control amplifier 38 according to control signals sent from the controller 18, as will be explained further below.

Additionally, the control amplifier 46 is configured to condition the laser driver current that is supplied to the laser 22 via the current line 27. A reference voltage is supplied to the control amplifier 46 to enable current conditioning such that the laser 22 operates under ideal conditions. Note that in the present embodiment, the laser 22 is a VCSEL, or vertical cavity surface emitting laser. However, it is appreciated that the laser 22 can comprise any one of a variety of laser device types, and is not limited to that explicitly shown in FIG. 3.

In addition to the control amplifiers listed above, laser current control circuitry, generally designated at 48, is disposed in the PA/LD 20 and cooperates with the control amplifier 46 to produce and condition the laser driver current that is supplied to the laser 22 via the current line 27. Various operational parameters of laser operation, such as the magnitude of laser current, can be controlled by the laser current control circuitry 48 via control signals sent by the controller 18 during transceiver operation. These control signals are received by the laser current control circuitry 48 via a signal line 49. As will be seen, the laser current control circuitry 48 therefore serves as a means for modifying the magnitude of the laser current in accordance with the present invention. The production, transmission, and nature of the control signals used by the laser current control circuitry 48 to achieve this means are explained in further detail below.

It is appreciated that the number and particular configuration of the control devices as described above can be varied without affecting the present invention. For instance, more or fewer control amplifiers can be utilized in the PA/LD, as well as control amplifiers that control operational parameters in addition to those discussed above. Further, control devices and other components that perform operations distinct from amplifying and conditioning transceiver signals can also be digitally controlled in accordance with the present invention. Thus, though the above discussion describes one embodiment where the present invention can be utilized, it should not be interpreted as being limiting of the invention in any way.

Continuing reference is made to FIG. 3, as well as to FIGS. 1 and 2, in describing various aspects of the present digital interface and associated components. As described, the digital serial interface 50 is established between the controller 18 and the PA/LD 20 as a means for digitally transmitting digital control signals from the controller to the PA/LD, thereby enabling the controller to digitally control the operational parameters of the various devices in the PA/LD 20, including the laser current control circuitry 48. In the present embodiment, the digital serial interface 50 comprises the first node 50A disposed on the controller 18 and a second node 50B disposed on the PA/LD 20. The digital nodes 50A and 50B can comprise any acceptable type of digital interface for transferring digital data, including those conforming to I2C and SPI protocols.

Three digital signal lines 52 are interposed between the two nodes 50A and 50B to enable various digital signals to be transferred therebetween. The first of these digital lines, 52A, is configured to transfer digital control signals from the controller 18 to one or more devices disposed in the PA/LD 20. The first digital signal line 52A can also be employed in one embodiment to transfer feedback data relating to the operation of the control devices from the PA/LD 20 back to the controller 18. The second digital signal line 52B is an enable line that is employed to coordinate the transfer of data between the controller 18 and the PA/LD 20 via the first signal line 52A. The third digital signal line 52C carries a clock signal so as to allow the controller 18 and the PA/LD 20 to coordinate the timing of data sent via the data line 52A. Though three digital signal lines 52 are shown here, it is appreciated that more or fewer than three lines 52 can extend between the nodes 50A and 50B. Indeed, a single digital signal line could be utilized, if desired. Also, each of the digital signal lines can be bi-directionally configured to enable data to flow in either direction between the controller 18 and the PA/LD 20, as explained further below. Further details regarding certain aspects of the digital serial interface and related components can be found in the United States Patent Application entitled "Optical Transceiver Module with Multipurpose Internal Serial Bus," filed on Oct. 8, 2002 (serial number pending), which is incorporated herein by reference in its entirety.

As seen in FIG. 2, the first node 50A of the digital serial interface 50 is operably connected to the glue logic device 34 of the controller 18, as already discussed. Similarly, as seen in FIG. 3, the second node 50B of the digital serial interface 50 is operably connected to a glue logic device 44 of the PA/LD 20. The glue logic device 44 is responsible for directing control signals received from the controller 18 via the digital serial interface 50 to the intended device in the PA/LD 20 or other component. Alternatively, the glue logic device 34 and 44 can comprise micro-controllers, if desired.

In addition, a plurality of digital-to-analog converters ("DACs") 43 is operably interposed between the glue logic device 44 and the control amplifiers 36, 38, 40, and 46, as well as the laser current control circuitry 48. Each DAC 43 is configured to convert a digital control signal received from the glue logic device 44 into an analog control signal that can be used by the control amplifiers 36, 38, 40, and 46 or laser circuitry 48 to modify a respective operating parameter. In the present embodiment, two DACs 43 are interposed between the glue logic device 44 and each of the control amplifiers 36, 38, and 40. Specifically, in the case of control amplifier 40, one DAC 43A is included for converting digital signals sent from the glue logic device 44 to control the rise time of the converted data signal received by the control amplifier from the ROSA 16, while one DAC 43B is included for converting control signals relating to the amplitude of the converted data signal. In the case of control amplifier 38, DAC 43C is included for converting digital control signals relating to the loss of signal hysteresis, and DAC 43D for the loss of signal threshold. In the case of control amplifier 36, DAC 43E is included for converting digital control signals relating to the rise time of the electrical data signal to be converted and transmitted by the TOSA 14, while the DAC 43F converts digital control signals relating to the amplitude of this data signal.

In addition, the devices responsible for providing and conditioning a laser current to the laser 22 are similarly connected to the glue logic device 44 via DACs 43. Specifically, one DAC 43G is included for converting digital control signals relating to the adjustment of a reference voltage via the control amplifier 46 associated with the laser bias current produced by the laser current control circuitry 48. Also, one DAC 43H is included for converting digital control signals relating to the provision of the laser driver current to the laser 22 via the laser current control circuitry 48, as explained further below.

As is seen by the above discussion, then, the controller 18 is operably connected to the control amplifiers 36, 38, 40, and 46, and the laser current control circuitry 48 via the glue logic 34, the digital serial interface 50, the glue logic 44, and the DACs 43. This configuration is presented as one embodiment of the present invention; other configurations that vary from that illustrated, such as the inclusion of components in addition to those described here, are also contemplated. Such other configurations include the use of more or fewer DACs than the number shown here to convert various operational parameters. Further, the glue logic device 44 as described herein is but one means for distributing digital control signals from the second node of the digital serial interface 50 to at least one of the digital-to-analog converters 43. Other devices with the same functionality can alternatively be used.

II. Operation of Transceivers

Continuing reference is made to FIGS. 1-3 in describing certain aspects of the operation of the optical transceiver 10 as described above in digitally controlling operational parameters of the above control devices. During transceiver operation, the controller 18 produces digital control signals data relating to one or more of the parameters that can be modified by the control devices 36, 38, 40, and 46, and the laser current control circuitry 48 as described above. These digital control signals can be produced by the glue logic device 34, or by another component of the controller 18. In the present embodiment, the glue logic device 34 can combine the digital control signal with other digital control signals to form a digital data word. For example, the digital data word can have a size of 40 bits. The 40-bit word can be parsed by the glue logic device 34 into five eight-bit sized sections. Each eight-bit word section can be programmed to carry control signal data relating to a particular operational parameter to be modified. Thus, each digital data word can comprise data to modify a plurality of operational parameters. Alternatively, other configurations for parsing and combining the digital control signals could be employed.

Once the digital data word is formed by the glue logic device 34, it is delivered to the first node 50A of the digital serial interface 50, where it is digitally transmitted to the second node 50B via the first digital signal line 52A. In the present embodiment, the digital data word is transmitted via the first signal line 52A, while the enable signal line 52B and clock signal line 52C ensure that transmission of the digital data word to the second node 50B occurs successfully and in a proper time frame.

Once the digital data word is received by the second node 50B of the digital serial interface 50, it is forwarded to the glue logic device 44 of the PA/LD 20, where it is decoded into its respective eight-bit sections and temporarily stored in memory registers, if necessary. These digital data word sections are then forwarded by the glue logic device 44 to the respective DACs 43A-H described above that correspond to the particular parameter to be modified. In one exemplary implementation, for instance, a digital data word forwarded by the glue logic device 34 of the controller 18 to the glue logic device 44 of the PA/LD 20 via the digital serial interface 50 can comprise eight-bit word sections containing, among others, a control signal in the first word section to modify the rise time operational parameter of the control amplifier 40 and a control signal in the second word section to modify the amplitude parameter of the control amplifier 36. In this case, then, the first digital data word section is forwarded to the DAC 43A, while the second section is forwarded to the DAC 43F.

Each digital data word section, once received by the respective DAC 43 to which it corresponds as determined by the glue logic device 44, is converted by the DAC from a digital control signal to an analog control signal, making it usable by the corresponding device. Each analog control signal is then forwarded from the respective DAC to the corresponding control amplifier 36, 38, 40, or 46, or laser current control circuitry 48 that is operably connected to the DAC 43. Thus, in the exemplary implementation above, the converted analog control signal from the first data word section corresponding to the rise time operating parameter is directed from DAC 43A to the control amplifier 40, while the converted analog control signal from the second data word section corresponding to the amplitude parameter is directed from DAC 43F to the control amplifier 36. The analog control signal, once received by the corresponding control device, modifies the parameter setting of the device. This in turn enables the amplifier 36, 38, 40, or 46, or laser current control circuitry 48 to modify the respective data, LOS, voltage signal, or current control signal passing through the control device. The parameter setting is retained by the control device until modified by a subsequent control signal sent by the controller 18. In this way, digital control of the various transceiver operating parameters is achieved. Because each digital data word sent by the controller 18 can comprise word sections, with each word section containing control signals for a different control amplifier, the parameters of multiple control amplifiers can be modified nearly simultaneously. The parameter modification process described above can be configured to occur periodically on a time increment basis. Alternatively, it can be configured to occur in response to an event detected by the controller 18 or by some other component.

In accordance with presently preferred embodiments, the present invention can be utilized to drive the laser driver current responsible for powering the laser 22 during transceiver operation, as already mentioned. This in turn enables the laser 22 to improve its eye pattern characteristics, resulting in a lower error rate for the transceiver in transmitting optical signals at high data rates, such as those exceeding 2 Gbits per second. Moreover, the principles of the invention can be used to improve the signal characteristics of optical signals having data rates of up to 10 Gbits per second, such as those associated with the 10 Gigabit Ethernet protocol, any those protocols that will be developed in the future with even higher data transmission rates.

As already mentioned, the laser current control circuitry 48 is responsible, together with the control amplifier 46, for producing the laser driver current that powers the laser 22 within the TOSA 14. The laser current control circuitry 48 can comprise various circuitry in order to perform this intended function. As seen in FIG. 3, the laser current control circuitry 48 is connected with the controller 18 via the glue logic device 34, the digital serial interface 50, the glue logic device 44, and the DAC 43H.

In greater detail, the laser current control circuitry 48 is configured to control the operational state of the laser 22 during transceiver operation by switching the laser between "on" and "off" states. The provision of a laser driver current from the laser current control circuitry 48 to the laser 22 via the current line 27 activates the laser to its "on" state. In its "on" state, the laser 22 receives the laser driver current, usually a DC bias current, which causes in turn an active region defined within the laser to be filled with charge carriers. This filling of the active region with charge carriers stimulates the emission of coherent light from the laser. When the laser driver current is removed from the laser 22 by the laser current control circuitry 48, the charge carriers present in the active region begin to dissipate, which causes the laser to cease producing coherent light.

The light produced by the laser 22 in its "on" state can correspond to a digital "one" or "zero" in an optical signal, depending on system calibration, while the absence of light in the laser's "off" state can conversely represent a digital "zero" or "one," respectively. The laser can be driven by the laser current control circuitry to transition between the "on" and "off" states at an extremely high frequency in order to convert and modulate electrical data signals received by the TOSA 14 into optical data signals for transmission to an optical communications network.

III. Improving Eye Pattern of Optical Signals

In the present embodiment, the controller 18 can be utilized in accordance with the present invention to drive the laser driver current in a specified manner so as to improve the optical characteristics of the laser 22 in transitioning between its "on" and "off" states. In the present embodiment, a digital control signal containing current driving instructions can be sent from the controller 18 via the digital serial interface 50, as described above in the previous example. Once received and distributed by the glue logic device 44, the DAC 43H converts the digital control signal to an analog control signal for receipt by the laser current control circuitry 48 via the signal line 49. This analog control signal is then used by the laser current control circuitry 48 to modify the laser driver current provided the laser 22 via the current line 27. In particular, the analog control signal directs the laser current control circuitry 48 to overdrive the laser driver current when transitioning from its "on" to its "off" state. If the laser driver control current is a DC bias current, the overdriving can be accomplished by reversing the bias of the DC current. In one embodiment, the control signal can be transmitted along the same current line 27 that is used by the laser driver current. However, in the present embodiment, the analog control signal is transmitted to the laser current control circuitry 48 via the control line 49, which is separate from the laser driver current signal line 27. As will be seen in FIG. 4, such digital driving of the laser driver current results in an improved optical signal produced by the laser.

Figure 4:
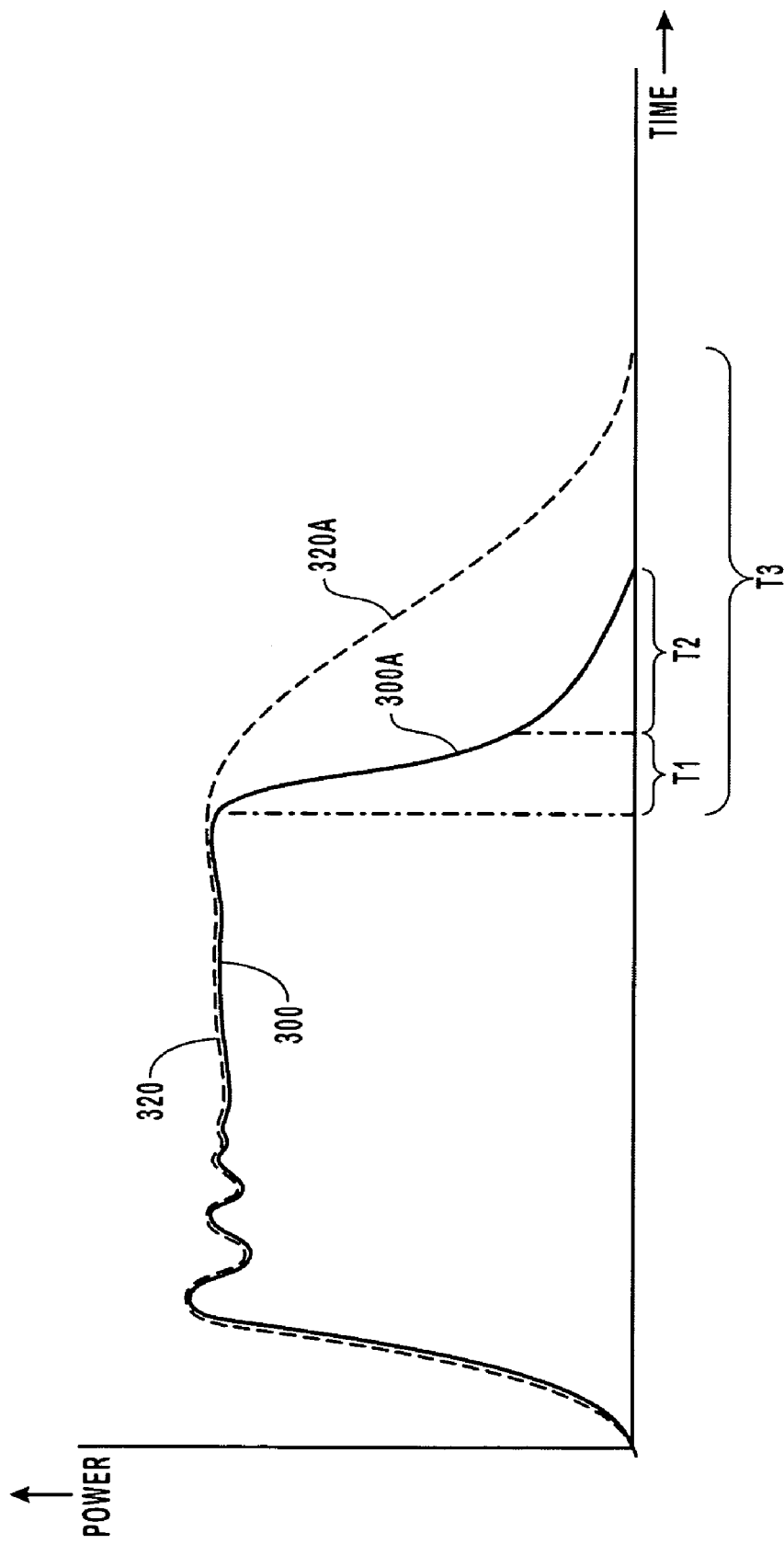
FIG. 4 is a schematic diagram illustrating details relating to the adjustment of peaking characteristics of a laser to improve eye pattern quality.

FIG. 4 is a graphical representation of the power associated with the optical signal generated by a laser 22. In particular, a waveform 300 conceptually represents the power associated with the generation of a pulse of light by a laser 22 of the TOSA 14 to represent data transmitted in an optical network. The laser 22 producing the waveform 300 is controlled via digital control signals from the controller 18, in accordance with the present invention as described above. In addition, a waveform 320 is superimposed with dashed lines atop the waveform 300 to represent the power associated with the generation of a pulse of light by a known laser not digitally controlled.

The waveform 320 depicted in FIG. 4 illustrates several characteristics of the operation of a laser in generating the optical signal pulse. For example, the waveform 320 illustrates that a typical laser used in optical networking responds relatively quickly to a signal to turn on (e.g., application of a current that excites charge carriers and causes the emission of light waves). A characteristic response to application of a current to the laser, as shown by the relatively steep rising edge, is that the output of the laser quickly increases to approximately the peak power output with some initial ringing that occurs as the peak power output is achieved. In contrast, when the laser receives a signal to turn off (e.g., removal of the current), the laser typically responds more slowly as charge carriers are drained from the active region of the laser. This is illustrated in waveform portion 320A in the relatively shallow slope of the falling edge of the waveform, which represents the falling power output of the laser after the removal of the laser driver current.

As mentioned, the asymmetric transient characteristics of the laser in response to the application and removal of the laser driver current and, in particular, the slower response to the removal of the current, typically results in a poor signal quality, which can be expressed in terms of a relatively poor eye pattern of the signal. This can be a problem that limits the upper range of the data transmission rate that can be achieved with a given laser. It is generally desirable to improve the symmetry of transient and other characteristics of the laser in response to the removal of the laser driver current, which in turn can improve the eye pattern of the signal generated by the laser.

According to the present embodiment, one of the operating parameters of the PA/LD 20 that is controlled using a digital control signal is the laser driver current used to turn the laser on and off. As already described above, upon removal of the laser driver current to change the state of the laser 22 from an "on" to an "off" state, a digital control signal sent from the controller 18 via the digital serial interface 50 and converted to an analog control signal via the DAC 43H overdrives, or peaks, the laser driver current, thereby causing the extraction of charge carriers from the active region of the laser at an enhanced rate, which more rapidly ceases coherent light emission. This peaking of the laser driver current caused by the analog control signal occurs for a first period of time T1 after transition of the laser 22 from the "on" to the "off" state. The first period of time T1 is shown in FIG. 4. During a subsequent, second period of time T2 (see FIG. 4), the peaking operation is stopped, and the charge carriers are allowed to drain from the active region at a relatively slower rate without the influence of the overdriven laser driver current. The combination of these two steps, particularly the first step of peaking the laser driver current, causes the laser 22 to turn off and cease light production more rapidly than would otherwise occur. Thus, the laser 22 experiences a relatively brief period of intense discharge, corresponding to time T1, followed by a normal level of discharge, corresponding to time T2. The resulting falling edge of the signal, illustrated at 300A in waveform 300, improves both the eye pattern of the resulting optical signal as well as the quality of the signal produced by the laser 22.

The digital signal that controls the application of the electrical signal described above can compensate for temperature conditions or for other conditions of the laser 22 and the optical transceiver 10 as necessary. The digital control signal that governs peaking of the laser driver current can be periodically transmitted from the controller 18 to the laser current control circuitry 48 to periodically adjust the operation of the laser 22 as set forth above, which further improves the eye quality over time and as the temperature or other conditions change.

It is appreciated that digital control signals transmitted in accordance with the present invention can be utilized to adjust characteristics of the laser signal waveform in addition to that just described. For instance, the waveform 320 can be modified via digital control signals from the controller 18 to adjust the slope of its leading edge, if desired. These and other modifications to the waveform 300 are contemplated.

While the invention can be advantageously implemented in the optical transceiver 10 as shown and described in FIGS. 1-3, the techniques for controlling the peaking characteristics of the laser driver current to improve the eye pattern associated with the optical signal generated by the laser 22 can also be practiced in other transceivers or transmitters. For instance, the invention can be practiced in optical transmitters that are disposed in a module without a corresponding optical receiver. In addition, the integration of the post-amplifier and laser driver is not required in order to practice the method of controlling the peaking characteristics of the laser driver current as described herein. Moreover, though described in a digital context here, the signal for controlling the peaking characteristics can be digital or analog, depending on the architecture of the transceiver and the laser driver.

In one embodiment, data transfer via the digital serial interface 50 is bi-directional, thereby enabling the controller 18 to not only send control signals to control devices on the PA/LD 20, but also to receive data from these or other devices of the PA/LD. In this case, the PA/LD 20 further includes analog-to-digital converters ("ADCs," not shown) disposed between the control amplifiers 36, 38, 40, and 46, and the glue logic device 44. These ADCs can convert analog signals received from the control devices, such as the control amplifiers 36, 38, 40, and 46, and laser current control circuitry 48, into digital signals for transmission to the controller 18 via the glue logic device 44 and digital serial interface 50. Such feedback can enable the controller 18 to adjust or modify the control devices in direct response to conditions reported by the amplifiers themselves. The feedback produced by this embodiment can be monitored by the glue logic 34 or by another component of the controller 18.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An optical transceiver module, comprising:
an optical transmitter assembly including a laser device capable of producing an optical signal in response to an electrical laser current;
an optical receiver assembly; and
a printed circuit board having disposed thereon:
a controller capable of producing digital control signals;
a laser driver capable of producing the electrical laser current for use by the laser device;
means for digitally transmitting the digital control signals from the controller to the laser driver;
at least one digital-to-analog converter in communication with the means for digitally transmitting, the at least one digital-to-analog signal converter configured to convert the digital control signals transmitted from the controller into analog control signals; and
means for modifying the magnitude of the electrical laser current in response to the analog control signals, wherein:
the means, in response to an analog control signal, peaks the electrical laser current such that a time to transition the laser from a first state, where the laser produces light, to a second state, where the laser produces no light, is relatively shorter than would be experienced without the electrical laser current peaking; and
the electrical laser current peaking, when performed by the means, begins no sooner than initiation of the transition from the first state to the second state and is completed prior to attainment of the second state.

2. An optical transceiver module as defined in claim 1, wherein said means for modifying enables the transceiver module to be utilized in optical communications networks having lines rates exceeding 2 Gbits per second.

3. An optical transceiver as defined in claim 1, wherein said means for modifying comprises integrated circuitry disposed on the laser driver.

4. An optical transceiver module as defined in claim 1, wherein the means for digitally transmitting the digital control signals comprises:
a digital signal interface operably interposed between the controller and the laser driver, wherein the digital signal interface is configured to transmit digital control signals between the controller and the laser driver.

5. An optical transceiver module as defined in claim 4, wherein said means for digitally transmitting is also configured to transmit digital control signals between the controller and the post-amplifier.

6. An optical transceiver module as defined in claim 4, further comprising a post-amplifier combined with the laser driver as a single integrated circuit on the printed circuit board.

7. An optical transceiver module as defined in claim 6, further comprising multiple control devices disposed in the integrated post-amplifier/laser driver, each of the control devices comprising an amplifier configured to modify at least one operational parameter related to the operation of the optical transceiver in response to at least one of the analog control signals converted by the at least one digital-to-analog signal converter.

8. An optical transceiver module as defined in claim 6, wherein the digital signal interface comprises a first node disposed on the controller, a second node disposed on the integrated post-amplifier/laser driver, and at least one digital signal line connecting the first node with the second node.

9. An optical transceiver module as defined in claim 8, further comprising means for distributing the digital control signals from the second node of the digital signal interface to the at least one digital-to-analog converter.

10. An optical transceiver module as defined in claim 9, wherein the means for distributing comprises a logic device disposed on the integrated post-amplifier/laser driver, the logic device interconnected with the second node of the digital signal interface and the at least one digital-to-analog converter.

11. An optical transceiver as defined in claim 1, wherein the electrical laser current peaking, when performed by the means, begins at about the time that the laser driver current ceases to be applied.

12. An optical transceiver for use in transmitting and receiving optical signals to and from an optical communications network, the optical transceiver comprising:
an optical signal transmitter assembly capable of transmitting optical signals to the optical communications network, the optical signal transmitter assembly including a laser having an active region configured to receive charge carriers and generate an optical signal in response to an electrical current;
an optical signal receiver assembly capable of receiving optical signals from the optical communications network; and
a printed circuit board on which are disposed:
a controller capable of producing a first digital control signal configured to drive the electrical current that is used by the laser;
an integrated post-amplifier/laser driver comprising a single integrated circuit device, the post-amplifier/laser driver configured to produce the electrical current that is used by the laser;
a digital interface operably interconnecting the controller component and the post-amplifier/laser driver, the digital interface configured to transmit the first digital control signal produced by the controller to the post-amplifier/laser driver;
a digital-to-analog converter configured to receive the first digital control signal from the digital interface and convert it into a first analog control signal configured to drive the electrical current that is used by the laser; and
a first control component capable of driving the electrical current that is used by the laser in response to the first analog control signal such that charge carriers are extracted from the active region of the laser at a first rate, wherein a first period of time T1, during which charge carriers are extracted from the active region at the first rate, expires prior to a time at which coherent optical output by the laser has ceased and wherein the charge carriers dissipate from the active region of the laser, after the period of time T1 expires, at a second rate, the second rate being less than the first rate.

13. An optical transceiver as defined in claim 12, wherein the laser comprises a vertical cavity surface emitting laser.

14. An optical transceiver as defined in claim 13, wherein the first control component comprises integrated circuitry disposed on the post-amplifier/laser driver.

15. An optical transceiver as defined in claim 14, wherein the electrical current comprises a DC current.

16. An optical transceiver as defined in claim 15, wherein the first analog control signal is configured to reverse the bias of the DC current.

17. An optical transceiver as defined in claim 16, wherein the digital interface further comprises:
a first node disposed on the controller;
a second node disposed on the post-amplifier/laser driver; and
at least two digital signal lines interconnecting the first node and the second node, wherein a first of the at least two digital signal lines is capable of carrying the digital control signals, and wherein a second of the at least two digital signal lines is capable of carrying a clock signal.

18. An optical transceiver as defined in claim 17, wherein the digital interface further comprises a third signal line interconnecting the first and second nodes of the digital interface, the third signal line capable of carrying an enable signal, the enable signal being used to confirm that a specified digital control signal has been transmitted from the controller to the post-amplifier/laser driver via the digital interface.

19. An optical transceiver as defined in claim 18, further comprising:
a logic device disposed on the post-amplifier/laser driver, the logic device configured to receive the first digital control signal from the digital interface and distribute the first digital control signal to the digital-to-analog converter.

20. An optical transceiver as defined in claim 19, further comprising:
a plurality of control amplifiers disposed in the post-amplifier/laser driver, each control amplifier configured to modify at least one operating parameter of the optical transceiver in response to additional digital control signals produced by the controller.

21. An optical transceiver as defined in claim 20, further comprising a memory component disposed on the controller, the memory component capable of storing feedback signals produced by the post-amplifier/laser driver.

22. An optical transceiver device as defined in claim 21, further comprising a logic device disposed on the controller, the logic device of the controller configured to direct digital control signals produced by the controller component to the digital interface.

23. An optical transceiver as defined in claim 22, wherein the electrical current is driven by the first analog control signal to extract charge carriers at the first rate when it is desired to cease the generation of the optical signal by the laser.

\* \* \* \* \*